United States Patent
Völkl et al.

[11] Patent Number: 5,985,026
[45] Date of Patent: Nov. 16, 1999

[54] SEED CRYSTAL FOR PRODUCING MONOCRYSTALS AND METHOD FOR PRODUCING SIC MONOCRYSTALS OR MONOCRYSTALLINE SIC LAYERS

[75] Inventors: Johannes Völkl, Erlangen; René Stein, Röttenbach, both of Germany

[73] Assignee: Siemens Aktiengesellschaft, Munich, Germany

[21] Appl. No.: 09/023,955

[22] Filed: Feb. 17, 1998

Related U.S. Application Data

[63] Continuation of application No. PCT/DE96/01152, Jun. 27, 1996.

[30] Foreign Application Priority Data

Aug. 16, 1995 [DE] Germany .............................. 195 30 119

[51] Int. Cl.$^6$ ................................................. C30B 25/02
[52] U.S. Cl. ............................ 117/95; 117/106; 427/250
[58] Field of Search ................................ 117/84, 95, 106; 427/248.1, 250

[56] References Cited

U.S. PATENT DOCUMENTS

| | | |
|---|---|---|
| 4,614,672 | 9/1986 | Addamiano . |
| 5,397,431 | 3/1995 | Kadomura . |

FOREIGN PATENT DOCUMENTS

| | | |
|---|---|---|
| 1544329 | 3/1971 | Germany . |
| 2420780 | 11/1974 | Germany . |
| 3620329A1 | 1/1987 | Germany . |
| 3915053A1 | 11/1990 | Germany . |
| 90/03452 | 4/1990 | WIPO . |
| 95/01410 | 4/1995 | WIPO . |

OTHER PUBLICATIONS

Japanese Patent Abstract No. 7257993 (Doi Hideyuki), dated Oct. 9, 1995.
Japanese Patent Abstract No. 5–105596 (Yoshihary Fujikawa et al.), dated Apr. 27, 1993.
Japanese Patent Abstract No. 4–55397 (Shigehiro Nishino), dated Feb. 24, 1992.
Japanese Patent Abstract No. 1–76997 (Takeshi Nogami), dated Mar. 23, 1989.
Japanese Patent Abstract No. 5–6158452, dated Dec. 7, 1981.
Japanese Patent Abstract No. 5–6105479, dated Aug. 21, 1981.
"Chemical vapor deposition of β–SiC on silicon–on–sapphire and silicon–on–insulator substrates", Pazik et al8347., Materials Science & Engineering, Jan. 15, 1992, No. 1/4, Lausanne, Switzerland, pp. 125–129.
"Formation of macrodefects in SiC", R.A. Stein, Phusica B 185, 1993, North–Holland, pp. 212–216.

*Primary Examiner*—Felisa Hiteshew
*Attorney, Agent, or Firm*—Herbert L. Lerner; Laurence A. Greenberg

[57] ABSTRACT

A seed crystal assembly for producing monocrystals and a method for producing SiC monocrystals or monocrystalline SiC layers include a seed crystal with a surface having a first partial region intended as a crystallization surface for a monocrystal grown out of a gas phase and a second partial region with a coating that is chemically resistant to the seed crystal and to the gas phase and does not melt at the growth temperatures. As a result, thermal degradation of the seed crystal is avoided and the quality of the monocrystals which are produced is increased.

15 Claims, 1 Drawing Sheet

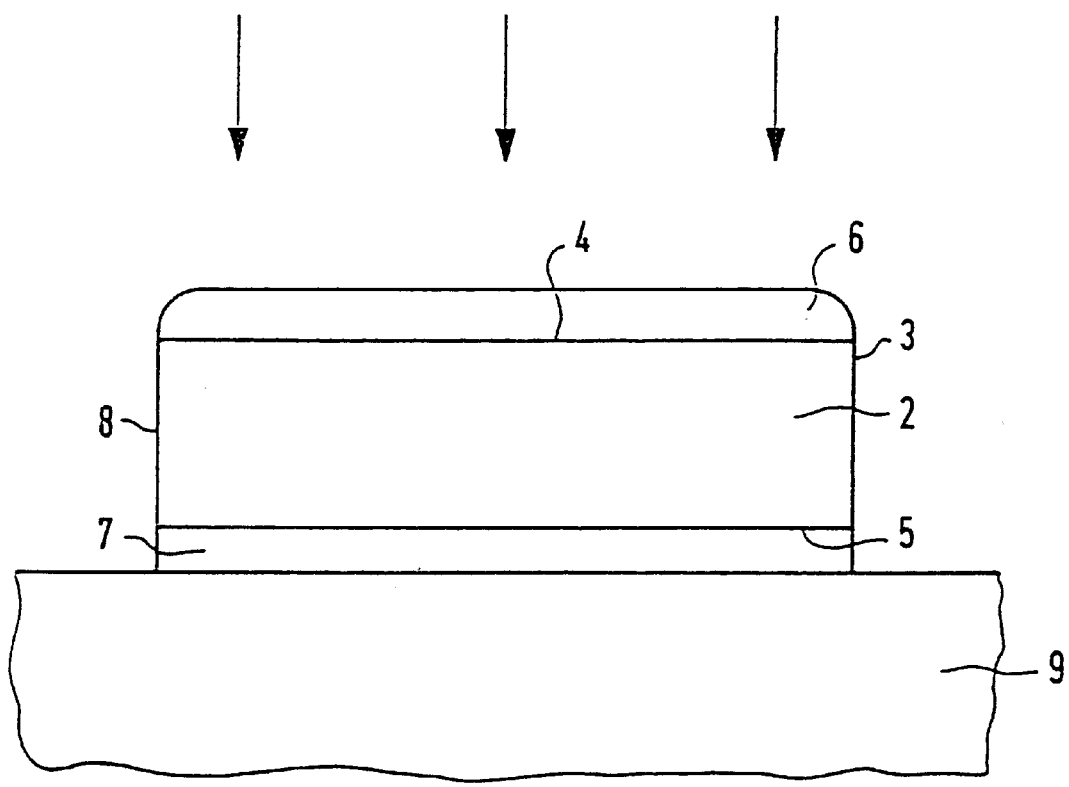

SEED CRYSTAL FOR PRODUCING MONOCRYSTALS AND METHOD FOR PRODUCING SIC MONOCRYSTALS OR MONOCRYSTALLINE SIC LAYERS

CROSS-REFERENCE TO RELATED APPLICATION

This application is a continuation of International Application Serial No. PCT/DE96/01152, filed Jun. 27, 1996, which designated the United States.

BACKGROUND OF THE INVENTION

Field of the Invention

The invention relates to a seed crystal for producing monocrystals and to a method for producing silicon carbide monocrystals or monocrystalline silicon carbide layers.

In order to cultivate silicon carbide (SiC) monocrystals, sublimation processes are known in which a starting batch of SiC is sublimated at temperatures generally above 2000° C., and an SiC monocrystal is grown on an SiC seed crystal from the sublimated SiC in the gas phase, at crystallization temperatures of generally between 1600° C. and 2500° C. The sublimation temperatures of the starting batch are higher than the growth temperatures at the seed crystal. A problem in sublimation cultivation of SiC is the crystal quality of the SiC monocrystals produced thereby. In particular, tubular crystal defects, known as micropipes or pinholes, impair the electronic properties of the cultivated SiC monocrystals. The problems of such crystal defects are described, for instance, in the book entitled: Physica B, Vol. 185, 1993, Elsevier science Publishers, North Holland, pp. 211–216.

SUMMARY OF THE INVENTION

It is accordingly an object of the invention to provide a seed crystal for producing monocrystals and a method for producing SiC monocrystals or monocrystalline SiC layers, which overcome the hereinafore-mentioned disadvantages of the heretofore-known products and methods of this general type, in which the special seed crystal produces monocrystals by crystallization out of a gas phase and with which crystal defects in a growing monocrystal can be reduced. In particular, the seed crystal should be usable for cultivating SiC monocrystals in a sublimation process or for producing monocrystalline SiC layers by CVD.

With the foregoing and other objects in view there is provided, in accordance with the invention, a seed crystal assembly for producing monocrystals, comprising a seed crystal formed of a given material and having a surface, the surface having a first partial region as a crystallization surface for growth of a monocrystal out of a gas phase, and the surface having a second partial region; and a coating disposed at least in the second partial region, the coating formed of a coating material substantially chemically resistant to the given material and to the gas phase, and the coating material having a melting point above growth temperatures.

Pinhole defects in the monocrystal growing on the seed crystal are reduced by using the special seed crystal.

The invention is based on the recognition that the quality of a monocrystal growing at predetermined growth temperatures on a seed crystal can become impaired by thermal decomposition (degradation) of the seed crystal on its free surface that is not acting as a crystallization surface. Such degradation is especially problematic in seed crystals that are formed of noncongruent sublimating or evaporating compounds. These are understood to mean compounds of at least two components, one component of which has a higher vapor pressure at the same temperature than the other, so that the stoichiometric ratio of the components in the seed crystal is perturbed. Diffusion processes with different diffusion rates for different components or nonhomogeneities in the seed crystal can also promote thermal degradation phenomena. The usually local degradation begins at the partial regions of the surface that, unlike the crystallization surface, are not covered by the growing monocrystal and that can propagate, in the course of a cultivation process, into the interior of the seed crystal. That can render the seed crystal unusable for further crystal cultivation processes, or else the crystal defects in the seed crystal can be transferred to the growing monocrystals in an ongoing or subsequent cultivation process.

Degradation in the seed crystal from its surface is reduced greatly by coating a partial region of the surface of the seed crystal that is located outside the crystallization surface in accordance with the invention. The coating is formed of one or more materials that are chemically stable with regard to the material of the seed crystal and of the at least one substance in the gas phase, and that do not melt or sublimate away at the growth temperatures being employed. As a result, the seed crystal can be used for a plurality of cultivation processes in succession, for instance 5 to 10 such processes, while the quality remains practically constant (the seed crystal can be recycled).

In accordance with another feature of the invention, the seed crystal in a first embodiment is formed of SiC and is intended for producing silicon carbide monocrystals, preferably from α-SiC such as 4H-SiC or 6H-SiC, in a sublimation process, or for producing monocrystalline SiC layers, preferably of α-SiC such as 4H-SiC or 6H-SiC, through the use of a CVD process.

In accordance with a further feature of the invention, the seed crystal is at least 0.5 mm thick and is thus self-supporting, in contrast to an epitaxial layer.

In accordance with an added feature of the invention, the coating for the second partial region of the surface is formed at least in part of a metal and/or a metal compound. Preferably, tantalum (Ta) and/or molybdenum (Mo) and/or tantalum compounds and/or molybdenum compounds are used. Metal silicides, metal carbides or metal nitrides can be used as the metal compounds.

In accordance with an additional feature of the invention, the coating for the second partial region of the surface of the seed crystal may also be at least partially formed of carbon, and preferably graphite.

In accordance with yet another feature of the invention, the coating for the second partial region of the surface includes a plurality of layers disposed on one another, which may be formed of identical or different materials.

In accordance with yet a further feature of the invention, the coating is preferably no thicker than approximately 100 µm. Preferred thicknesses of the coating are between approximately 0.5 µm and approximately 100 µm.

In accordance with yet an added feature of the invention, the coated second partial region of the surface of the seed crystal is preferably disposed on a side of the surface of the seed crystal remote the first partial region acting as a crystallization surface.

With the objects of the invention in view, there is also provided a method for producing silicon carbide monocrystals, which comprises providing the seed crystal; at least partially sublimating silicon carbide in solid form; and growing an SiC monocrystal from the sublimated SiC, in the gas phase, at least at a predetermined growth temperature on the first partial region of the surface of the seed crystal.

With the objects of the invention in view, there is additionally provided a method for producing a monocrystalline silicon carbide layer, which comprises providing the seed crystal; and depositing a silicon carbide layer by chemical deposition from the gas phase on the seed crystal as a substrate.

Other features which are considered as characteristic for the invention are set forth in the appended claims.

Although the invention is illustrated and described herein as embodied in a seed crystal for producing monocrystals and a method for producing SiC monocrystals or monocrystalline SiC layers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The FIGURE of the drawing is a fragmentary, diagrammatic, cross-sectional view of an exemplary embodiment of a seed crystal for the cultivation of SiC monocrystals according to the invention.

DESCRIPTION OF THE PREFERRED EMBODIMENTS

Referring now in detail to the single FIGURE of the drawing, there is seen a seed crystal 2, a surface 3 of the seed crystal 2, a first partial region or area 4 of the surface 3, a second partial region or area 5 of the surface 3, a third partial region or area 8 of the surface 3, an SiC monocrystal 6, a coating 7 and a seed holder 9.

The seed crystal 2 preferably is formed of monocrystalline SiC of a predetermined polytype, especially the 3C, 4H or 6H polytype. The first partial region 4 of the surface 3 of the seed crystal 2 is intended as a crystallization surface for the crystallization (condensation) of the SiC monocrystal 6 out of SiC in the gas phase. The first partial region 4 which is intended as the crystallization surface may in particular be formed by one of the two polar sides (basal planes), that is a silicon side or a carbon side, of the SiC seed crystal 2. The crystallization surface 4 is supplied with SiC in the gas phase, which is preferably generated by sublimation from solid SiC out of a non-illustrated SiC starting batch. Sublimated SiC in the gas phase generally is formed of the components Si, $Si_2C$ and $SiC_2$ as well as SiC itself in the gaseous state. The SiC monocrystal 6 grows on the crystallization surface 4 of the seed crystal 2 from the SiC in the gas phase, at predetermined growth temperatures (crystallization temperatures). Typical growth temperatures at the crystallization surface 4 are between approximately 1600° C. and approximately 2500° C.

The seed crystal 2 may in particular be in wafer form and is generally disposed on the seed holder 9. The seed holder 9 may, for instance, be formed of graphite. In particular, the seed crystal 2 may be disposed in an upper part of a non-illustrated reaction vessel, and the SiC starting batch may be disposed in a lower part of the reaction vessel. The seed crystal 2, particularly in this embodiment, is then preferably secured to the seed holder 9, for instance mechanically or through the use of a sugar solution acting as an "adhesive". If the seed crystal 2 is disposed in a lower portion of the reaction vessel, then it is also possible for the seed crystal 2 to merely rest on the seed holder 9. The second partial region 5 of the surface 3 of the seed crystal 2 which is oriented toward the seed holder 9, and the first partial region 4 of the surface 3 which is intended as a crystallization surface, preferably are on opposed sides of the seed crystal 2. Side surfaces of the seed crystal 2 that interconnect the first partial region 4 and the second partial region 5 form the third partial region 8 of the surface 3 of the seed crystal 2.

In the non-illustrated SiC starting batch, for sublimating (evaporation) of SiC, a sublimation temperature is set that is preferably higher than the crystallization temperature at the crystallization surface 4 of the seed crystal 2 and that is generally between 2000° C. and 2600° C. A temperature gradient which is established between the SiC starting batch and the seed crystal 2, has a course that can additionally be adjusted through the use of additional thermal insulations and/or heating devices and/or the geometrical disposition of the seed crystal 2 and the SiC starting batch relative to one another. The result of the temperature gradient between the SiC starting batch and the first partial region 4 of the seed crystal 2 is that a temperature gradient is also established between the seed crystal 2 and the seed holder 9, on the basis of which latter gradient silicon can escape from the SiC of the seed crystal 2.

The surface 3 of the seed crystal 2 is therefore provided with the coating 7, in the second partial region 5 toward the seed holder 9, so that the coating 7 comes to rest between the second partial region 5 of the surface 3 of the seed crystal 2 and the seed holder 9. The coating 7 seals off the second partial region 5 of the surface 3 of the seed crystal 2, which is covered by the coating 7, and prevents the escape of substances from the seed crystal 2 resulting from the high temperatures in the second partial region 5 of the surface 3 and the attendant degradation of the seed crystal 2. In particular, the coating 7 prevents the following:

1. the sublimation of silicon (Si) from the SiC in the reaction vessel, for instance through pores in the seed holder 9 or through interstices between the seed crystal 2 and the seed holder 9 that are formed in particular in a preceding mechanical machining operation;
2. the diffusion of silicon in particular out of the seed crystal 2 into the seed holder 9; as well as
3. a chemical reaction of the silicon from the SiC of the seed crystal 2 with the material (such as graphite) of the seed holder 9.

To that end, one or more materials are used for the coating 7 that do not evaporate at the growth temperatures which are employed, namely materials that do not react chemically with either the SiC of the seed crystal 2 or the SiC in the gas phase in the reaction vessel. Slight variation in the composition or a crystallographic modification change in the coating 7 during the sublimation process are allowable, as long as the aforementioned properties of the coating 7 are preserved.

If the coating 7 is in contact with a seed holder 9 as shown, then the coating 7 should also be chemically resistant to the material of the seed holder 9.

Suitable materials for the coating 7 are, for instance, high-melting metals such as tungsten (W), tantalum (Ta) or molybdenum (Mo) and compounds of these metals with one another, such as alloys, and with other chemical elements. Preferred metal compounds are metal silicides, metal carbides and metal nitrides. Tantalum carbide, such as TaC or $Ta_2C$, or molybdenum carbide, such as MoC, $Mo_2C$, $Mo_3C_2$ or $Mo_5C_5$, can be used in particular as a metal carbide. Tantalum nitride TaN or $Ta_2N$ is especially suitable as the metal nitride. Metal oxides can also be used.

The coating 7 may also be at least partially formed of elemental carbon © of various modifications, preferably with a high density and particularly graphite (pyrographite).

The coating 7 can be applied to the second partial region 5 of the surface 3 of the seed crystal 2 by melting, thermal vapor deposition in a vacuum, chemical vapor deposition (CVD), electron beam evaporation, reaction sintering, laser ablation, plasma coating, or sputtering.

In an advantageous embodiment, the coating 7 includes a plurality of individual foils or layers, which are disposed one above the other. In order to provide this kind of multilayer coating, different materials can be provided, which are layered one above the other in sandwich fashion. In a multilayer coating, it is advantageous if the innermost layer disposed directly on the surface 3 of the seed crystal 2 has a higher content of carbon (C) than silicon (Si), in order to prevent silicon transport out of the seed crystal 2.

Due to the coating 7, there may even be relatively large interstices between the seed crystal 2 and the seed holder 9. The requirements for mechanical machining quality are therefore lower than for a seed crystal 2 that lacks a coating 7 and must be adapted precisely to the seed holder 9. In a particular non-illustrated embodiment, the seed crystal 2 no longer rests on a seed holder but instead is self-supporting in the reaction vessel.

In another non-illustrated embodiment, not only the second partial region 5 but also the third partial region 8 of the surface 3 of the seed crystal 2 is provided with a coating. In the illustrated embodiment, this can be attained in particular by also extending the coating 7 over the lateral surfaces of the seed crystal 2, so that outside of the crystallization surface 4, the surface 3 of the seed crystal 2 is practically fully coated (sealed).

Although the seed crystal according to the invention has been described in terms of an exemplary embodiment for an SiC sublimation process, a seed crystal coated according to the invention can be employed for all crystal cultivation processes in which thermal degradation of the seed crystal can occur because of the high growth temperatures at the seed crystal, and in particular for a CVD process for producing monocrystalline SiC layers (CVD stands for Chemical Vapor Deposition). In a CVD process, working gases for supplying silicon (Si) and carbon (C) and generally a carrier gas, preferably hydrogen ($H_2$), are carried to the crystallization surface of the seed crystal. Monocrystalline SiC is deposited on the seed crystal at temperatures that typically are between approximately 1000° C. and approximately 2500° C. by chemical reactions.

We claim:

1. A seed crystal assembly for producing monocrystals, comprising:

a) a seed crystal formed of a given material and having a surface, said surface having a first partial region as a crystallization surface for growth of a monocrystal out of a gas phase, and said surface having a second partial region; and b) a coating disposed at least in said second partial region, said coating formed of a coating material substantially chemically resistant to said given material and to the gas phase, and said coating material having a melting point above growth temperatures.

2. The seed crystal assembly according to claim 1, wherein said given material is formed of silicon carbide.

3. The seed crystal assembly according to claim 1, wherein said coating for said second partial region of said surface is substantially formed of at least one of a metal and a metal compound.

4. The seed crystal assembly according to claim 1, wherein said coating for said second partial region of said surface is at least partially formed of a metal silicide.

5. The seed crystal assembly according to claim 1, wherein said coating for said second partial region of said surface is at least partially formed of a metal carbide.

6. The seed crystal assembly according to claim 1, wherein said coating for said second partial region of said surface is at least partially formed of a metal nitride.

7. The seed crystal assembly according to claim 1, wherein said coating for said second partial region of said surface is at least partially formed of at least one of tantalum and a tantalum compound.

8. The seed crystal assembly according to claim 1, wherein said coating for said second partial region of said surface is at least partially formed of one of molybdenum and a molybdenum compound.

9. The seed crystal assembly according to claim 1, wherein said coating for said second partial region of said surface is at least partially formed of carbon.

10. The seed crystal assembly according to claim 1, wherein said coating for said second partial region of said surface is at least partially formed of graphite.

11. The seed crystal assembly according to claim 1, wherein said coating for said second partial region of said surface includes a plurality of layers disposed on one another.

12. The seed crystal assembly according to claim 1, wherein said second partial region of said surface is disposed on a side of said surface facing away from said first partial region.

13. The seed crystal assembly according to claim 1, wherein said coating is at most approximately 100 $\mu$m thick.

14. The seed crystal assembly according to claim 1, wherein said coating is at most approximately 10 $\mu$m thick.

15. The seed crystal assembly according to claim 1, wherein said seed crystal has a thickness of at least 0.5 mm, measured perpendicular to said crystallization surface.

* * * * *